United States Patent [19]

Silagi

[11] Patent Number: 4,532,478

[45] Date of Patent: Jul. 30, 1985

[54] PHASE ADJUSTED FEEDFORWARD SYSTEM UTILIZING A SINGLE AMPLITUDE/PHASE EQUALIZER

[75] Inventor: Edward G. Silagi, Cedar Rapids, Iowa

[73] Assignee: Rockwell International Corporation, El Segundo, Calif.

[21] Appl. No.: 615,397

[22] Filed: May 30, 1984

[51] Int. Cl.³ .............................................. H03F 1/26
[52] U.S. Cl. .................................. 330/151; 330/149; 330/304; 328/162
[58] Field of Search ....................... 330/149, 151, 304; 328/162

[56] References Cited
FOREIGN PATENT DOCUMENTS 2656436  6/1978  Fed. Rep. of Germany ...... 330/151

Primary Examiner—James B. Mollins
Assistant Examiner—G. Wan
Attorney, Agent, or Firm—George A. Montanye; H. Fredrick Hamann

[57] ABSTRACT

There is disclosed a feedforward system which reduces the phase and amplitude equalizer circuits necessary to provide for circuit operation. The main and error amplifiers of a phase adjusted feedforward system are constructed to have essentially equivalent delay and gain characteristics. The two loops formed by the main and error amplifiers are then phase and amplitude equalized by use of one phase/amplitude equalizer in the small signal loop between the output coupler and the hybrid junction. The circuit may be implemented with less complex structure, thereby resulting in additional circuit simplification and less cost.

6 Claims, 7 Drawing Figures

PHASE ADJUSTED FEEDFORWARD SYSTEM UTILIZING A SINGLE AMPLITUDE/PHASE EQUALIZER

BACKGROUND OF THE INVENTION

The present invention relates to amplifiers and more particularly to high power, high frequency amplifiers employing feedforward control for improved linearity.

High power amplifiers for use in communications and other environments are requiring improved performance in terms of power amplifier linearity and bandwidth. While certain high performance systems presently utilize vacuum tube technology, the same is not compatible with changing communications environments requiring solid state power amplifier designs to reduce size, weight and cost as well as to allow greater network simplicity and improved reliability. However, before such conventional vacuum tube systems can be replaced with solid state designs, there must be significant improvements in the characteristics of such solid state amplifier circuits in terms of improvements in intermodulation distortion and transmitted noise performance.

By way of example, current linear power amplifiers constructed for use in high frequency environments have limited performance because of device non-linearities. In particular, such non-linearities introduce distortion into the output of the power amplifier and some technique must be used to reduce intermodulation distortion to acceptable levels before the linear power amplifiers will attain high versatility. Accordingly, two known methods of reducing such intermodulation distortion include feedback and feedforward techniques.

As is known in the art, both of the above methods have inherent drawbacks which limit their applicability to linear power amplifiers. Specifically, in the case of feedback systems, the greatest problem in implementing the amplifier is in maintaining its stability under a variety of operating conditions. More particularly, because a feedback system is correcting for an error that has already occurred in an earlier timeframe, acceptable results can only be achieved at the expense of increased gain and bandwidth requirements. Such circuits therefore sacrifice efficiency and bandwidth to achieve distortion reduction for use in high power and high frequency systems.

In other instances, the intermodulation distortion problem has been addressed by using a feedforward concept. This concept is well known and is described in such U.S. Pat. Nos. as 1,686,792; 2,102,671; 3,471,798; and more recently in U.S. Pat. No. 4,352,072, assigned to the same assignee as the present invention each of which is incorporated by reference herein in its entirety. The operation of such circuits to reduce intermodulation distortion and provide improved stability, as well as the elements used to implement such systems, is clearly referenced in the above-identified patents and additionally in the article entitled "Feedforward—An Alternative Approach to Amplifier Linearization" by T. J. Bennett and R. F. Clements in the *Radio and Electronic Engineer*, Vol. 44, No. 5, May 1974. Such systems apply error correction without feedback and accordingly provide improved linearity by compensating in the same timeframe that any distortion within the amplifier is created.

In such feedforward systems, the error correction is accomplished by sampling the distorted output from the main amplifier and removing the undistorted input from that output through a hybrid junction. The resulting output from the hybrid junction then includes only the distortion products created by the main amplifier. The level of the distortion products is then raised to an appropriate level by an error amplifier and subtracted from the main amplifier output by an injection coupler. The result is an output signal amplified by the main amplifier with the distortion products subtracted from that main amplifier output during the same timeframe. In operation, the signal delays in all parallel paths are equalized by the use of phase equalizers and coaxial lengths having the same delay characteristics in both the main amplifier and error amplifier loops. This thus removes the distortion products in the same timeframe that the distortion is created without requiring direct feedback paths which would render the system unstable under varying operating conditions.

While such feedforward systems as are described in the prior art provide improved performance at low power levels, the same have limitations when implemented in systems to be used at higher power levels. Such problems are basically caused by the delays encountered resulting from the multiple stage amplification of the main and error amplifiers, and the phase and amplitude linearity requirements over frequency for the main and error amplifiers. In particular, the delay lines used in such prior art feedforward systems take the form of lengths of coaxial cable which typically may be constructed as a thirty-foot length of RG-213 coax. This cable will produce a 30 watt loss in a 500 watt system and proves to be bulky and space-consuming, contrary to the requirements of current communications equipment. Furthermore, in order to maintain phase and amplitude linearity over frequency, high power phase equalizers of increased complexity in design and implementation must be used. This tends to be expensive and complex and reduces the overall desirability of such high power systems requiring phase equalization.

In order to overcome the above problems, a system and technique is proposed in a co-pending application Ser. No. 615,500 entitled "A Phase Adjusted Feedforward Error Correction Circuit" by E. G. Silagi and M. W. Heidt, filed on even date herewith and assigned to the same assignee, which application is hereby incorporated by reference in its entirety. Although such a system improves the performance of feedforward circuits, there are still an unlimited number of practically realizable phase shift networks which may be used to produce the phase shift necessary in the feedforward systems of the aforementioned application. More specifically, the need for variable phase shift with constant impedance and amplitude response is necessary under electronic control in order to implement the improved circuits while reducing cost, weight, and complexity, while improving reliability. This realization becomes more difficult as the bandwidth of operation increases, for example greater than one octave.

For implementing such phase shift circuits in the high frequency spectrum of 2–30 MHz (nearly four octaves), the practical implementation thus becomes more difficult. One method of realizing a constant impedance all-pass network is by the use of a conventional lattice network including inductors and capacitors which are electronically variable. However, while the phase shifted frequency range may be physically realizable in certain ranges of operation, the same may not be true for all frequency and phase shift ranges necessary for operating in the high frequency spectrum. In addition, more complicated control circuitry is necessary to make the circuit work over such broad frequency ranges. Accordingly, the network described in the co-pending application entitled "Phase Shift Network with Minimum Amplitude Ripple" by E. G. Silagi, filed on even date herewith and assigned to the same assignee as the present application (which application is incorporated herein by reference in its entirety) has been proposed to more effectively provide phase shift in feedforward systems.

Although the improved feedforward error correction system and the improved phase shift network described in the aforementioned co-pending applications provide improved feedforward performance by reducing the complexity and improving the power loss problems in contrast to the prior art, the number of phase shift networks is still equal to that of the prior art. In addition, the need for active control of the phase equalizers requires additional control circuitry to maintain proper response over the range of frequency at which the system operates. Accordingly, there is still a need to provide feedforward systems of reduced complexity while still accomplishing the broad objectives of feedforward control.

Accordingly, the present invention has been developed to overcome the specific shortcomings of the above known and similar techniques and to provide a feedforward system having a reduced number of equalizers for system operation.

SUMMARY OF THE INVENTION

In accordance with the present invention, a feedforward system is constructed wherein an input signal is coupled through a main amplifier to provide a main output signal. The input signal is sampled by an input coupler to provide that sample to a hybrid junction. Likewise, the main output signal is sampled and coupled through an amplitude/phase equalizer to provide a sampled output signal to the hybrid junction. The sampled input signal is subtracted from the sampled output signal in the hybrid junction to produce an error correction signal which is coupled through an error amplifier and subtracted from the main output signal in an injection coupler. The output from the injection coupler then forms the RF output from the amplifier with intermodulation products removed.

It is therefore a feature of the invention to provide a feedforward system having reduced complexity.

Yet another feature of the invention is to provide a feedforward system which requires only one amplitude/phase equalizer in the control system.

It is a further feature of the invention to provide a feedforward system which employs main and error amplifiers having similar gain and delay characteristics so that the main and control loops of the feedforward system are substantially equal.

Still a further feature of the invention is to provide a feedforward system of reduced complexity which reduces power loss by including phase and amplitude equalization in a small signal path.

These and other objects and novel features of the invention will become apparent from the following detailed description when considered with the accompanying drawings wherein:

DETAILED DESCRIPTION OF A PREFERRED EMBODIMENT

Figure 1:
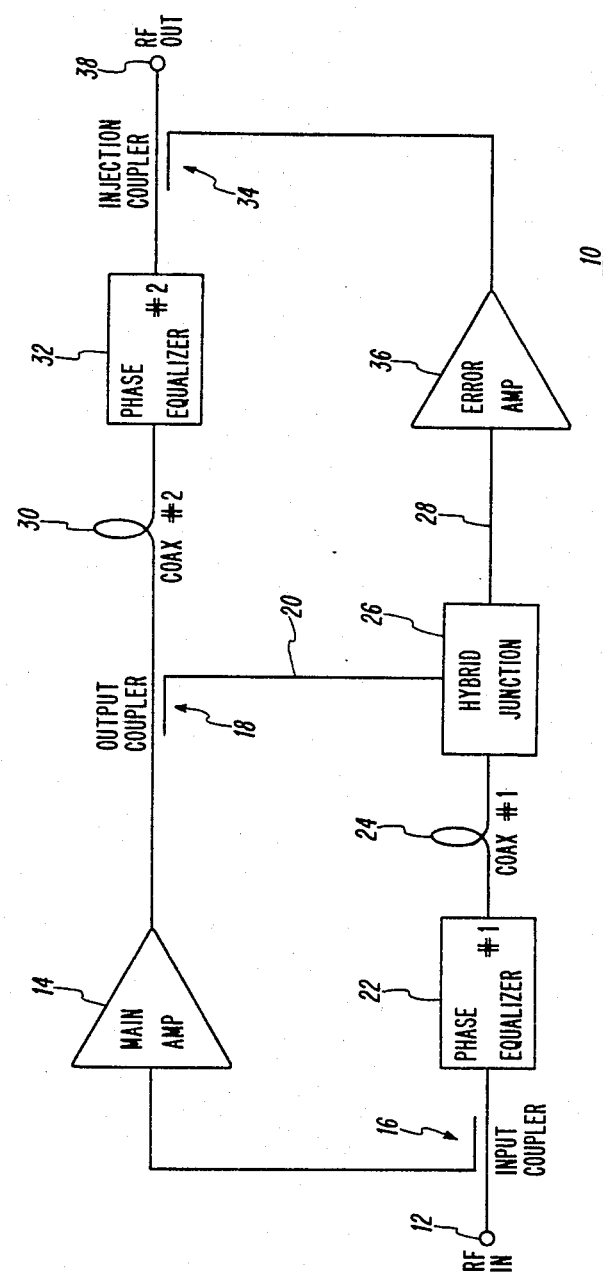
FIG. 1 is a schematic diagram showing a generic feedforward system known in the prior art.

Referring now to the drawings, wherein like numerals are used to refer to like elements throughout, there is shown a feedforward correction circuit used in connection with a high power amplifier system as is known in the prior art. This feedforward system 10 includes an input for receiving radio frequency (RF) energy over the frequency spectrum of use and may include the high frequency (HF) range of radio frequency energy. The RF input (generally a carrier modulated by an information signal) is provided to terminal 12 as the fundamental input signal (desired signal) which is coupled to the main power amplifier 14. The RF input from terminal 12 is also sampled by an input coupler 16 to provide a sample of the input signal in a conventional manner. Such input coupler may be a conventional 3 dB coupler for providing a sample of the input signal. The output from the main amplifier 14 is coupled to an output coupler 18 which provides the amplified desired output signal and allows a sample of that output signal to be made from the output coupler 18 over line 20. Again, the output coupler may be a conventional coupler such as a 10 dB coupler of conventional construction.

The sample of the input signal from coupler 16 is coupled through a phase equalizer 22 and a length of coaxial cable 24 to one input of a conventional hybrid junction 26. Likewise, the sampled output signal on line 20 is coupled as a second input to that same hybrid junction 26 so that the output sample on line 20 and the input sample from coupler 16 are subtracted in the hybrid junction 26 to provide a difference output on the line 28 representing distortion products produced by the main amplifier 14 as will be described below. The amplified output signal through coupler 18 is coupled through a second length of coaxial cable 30 and through a second phase equalizer 32 of conventional construction and thence provided to a conventional injection coupler 34. The difference signal representing the distortion products as an error signal on line 28 is amplified through error amplifier 36 and provided as one input to the injection coupler 34 where it is subtracted from the amplified output signal to produce a main amplifier output 38 with intermodulation products removed.

The above conventional system operates in a known manner to subtract an output sample on line 20, which includes an amplified input signal plus intermodulation products produced by the main amplifier 14, from an undistorted input signal represented by the input sample from coupler 16 so that the output on line 28 from the hybrid junction 26 is only a signal representing the distortion products created by the main amplifier 14. The distortion products created by the main amplifier 14 and represented by the correction signal on line 28 is amplified to an appropriate level by the amplifier 36 and subtracted from the main amplifier output through the injection coupler 34. The result is an output signal amplified by the main amplifier 14 with the distortion products created by the main amplifier 14 removed.

As will be appreciated, signal delays in the above system are equalized by the use of phase equalizer 22 and coax 24 which have the same delay characteristics as the main amplifier signal path which includes main amplifier 14, output coupler 18 and line 20. Likewise, signal delays in the above system are equalized by the use of phase equalizer 32 and coax 30 which have the same delay characteristics as the error amplifier signal path which includes line 20, hybrid junction 26, line 28 and error amplifier 36. Since both the main and error signals are thus delayed equally, the subtraction in the injection coupler 34 produces distortion removal which takes place in the same timeframe as the distortion is created. Thus, the feedforward signal acts to remove distortion without the requirement for feedback, thereby resulting in an unconditionally stable system under normal operating conditions.

As was noted above, because of delays encountered from the multiple stage amplification of the main and error amplifiers 14 and 36, the delay lines formed by coax cables 24 and 30 tend to be bulky and power consuming. Typically, the coax delay lines 24 and 30 are formed as 30-foot lengths of RG-213 coaxial cable which has a loss of about 30 watts in a 500 watt system. In addition to being bulky and space-consuming, this significant power drain is prohibitive at the high power levels required for high frequency systems. Furthermore, the system of FIG. 1 requires the main and error amplifiers to be substantially linear in phase and amplitude over frequency in order to operate over the frequency range of the system. If such linear phase and amplitude is not maintained, the phase equalizers 22 and 32 must compensate for the non-linearities, thereby necessitating structures which become increasingly complex in design and implementation.

Figure 2:
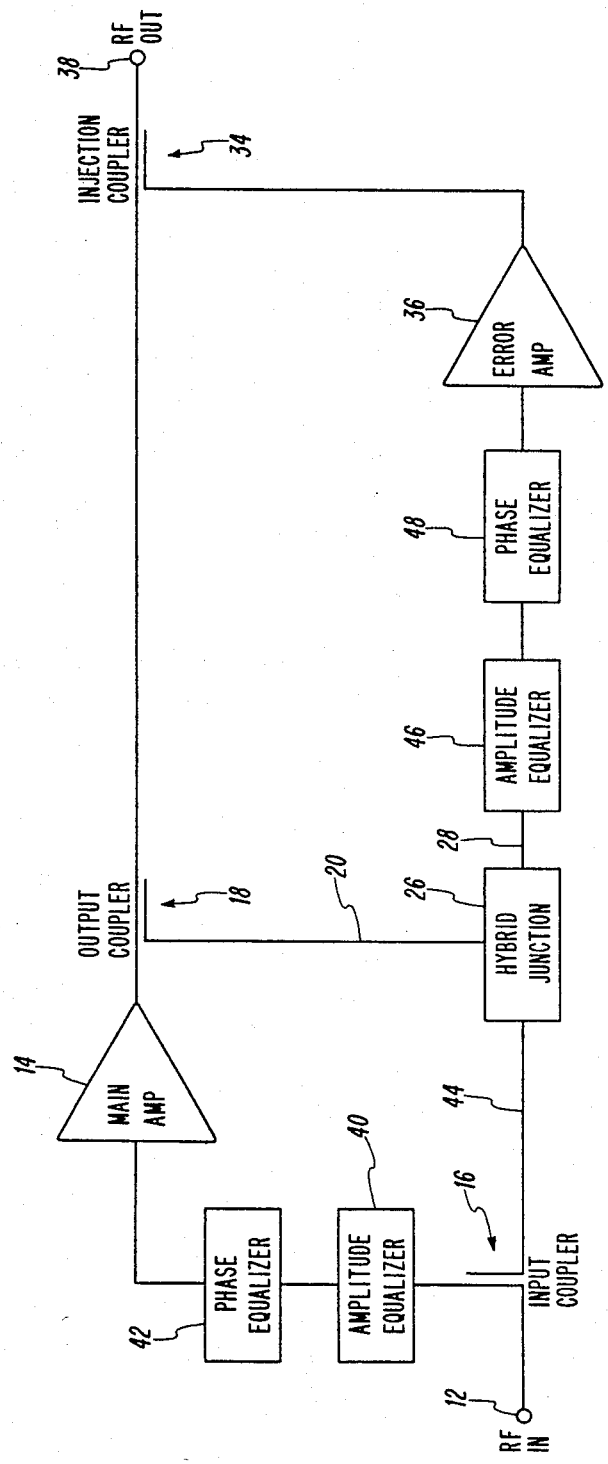
FIG. 2 is a schematic diagram showing an improved phase adjusted feedforward system.

Contrary to the above prior art system, the invention of the aforementioned co-pending application entitled "A Phase Adjusted Feedforward Error Correction Circuit" has been proposed to reduce the complexity of the system while still providing feedforward control having inherent stability and conventional bandwidth characteristics. Referring now to FIG. 2, there is shown an embodiment incorporating the improved phase adjusted feedforward error correction technique of the noted application. More specifically, RF is again coupled to an input terminal 12 and through an input coupler 16 to provide a main input signal and a sampled input signal. The main input signal is coupled through an amplitude equalizer 40 and a phase equalizer 42 and thence through a main amplifier 14 to one terminal of an output coupler 18. The sampled output from output coupler 18 is provided on line 20 to one terminal of the hybrid junction 26 while the sampled input signal from input coupler 16 is provided over line 44 to a second terminal of the hybrid junction 26. The main amplifier output signal from output coupler 18 is coupled to one terminal of an injection coupler 34 which in turn provides its output as the RF output 38. The error correction signal from line 28 is coupled through an amplitude equalizer 46 and thence through a phase equalizer 48 and error amplifier 36 to provide the amplified error correction signal to a terminal of the injection coupler 34 for subtracting distortion from the main amplifier output signal in the injection coupler 34.

In accordance with the circuit shown in FIG. 2, the fundamental (desired) signal of the main amplifier 14 is produced by amplifying the RF input signal at terminal 12, after phase and amplitude equalization through elements 40 and 42. The sample of this main amplifier output signal which is taken by output coupler 18 and which exists on line 20 is forced to be equal in amplitude and phase with the input sample on line 44 by those elements 40 and 42. Likewise, as in the system shown in FIG. 1, the hybrid junction removes the fundamental signal from the output sample by subtracting the input sample on line 44 from the output sample on line 20 in the hybrid junction 26 to produce a correction signal on line 28 which is only the distortion products generated by the main amplifier 14. The products represented by this correction signal on line 28 are then forced to be equal in amplitude and phase with the distortion products out of the main amplifier 14 by amplitude equalizer 46 and phase equalizer 48 and the error amplifier 36. The phase and amplitude equalized correction signal is then subtracted from the main amplifier output signal in the injection coupler 34 to produce an amplified output 38 of the input signal at terminal 12 without the intermodulation products introduced by main amplifier 14.

In operation, the above system is inherently more stable than a conventional feedback system and therefore operates more efficiently without the requirement for the substantial gain and bandwidth needed to effect distortion reduction in accordance with prior art feedback systems. It should be noted, however, that in contrast to the circuit of FIG. 1, the correction is not being made in the same timeframe as that in which distortion has taken place. As a result, the correction is being made on a succeeding RF cycle (similar to feedback operation) and therefore causes the circuit to become less effective as the modulation frequency of the RF carrier approaches the carrier frequency. In addition, this phase adjusted feedforward system will also lack the instantaneous bandwidth of a conventional feedforward system.

However, the above is more than offset by the use of phase and amplitude equalization wherein that equalization is performed in the small signal paths of the feedforward system. Specifically, amplitude and phase equalizers 40 and 42 act on the unamplified RF input signal at terminal 12 while the amplitude and phase equalizers 46 and 48 operate on a low amplitude correction signal from the hybrid junction 26. Thus, the losses in the main output path as a result of the coax cable 30 used in connection with FIG. 1, is eliminated. In addition, because the equalizers are coupled in small signal paths, they may be built with low power space-saving components, thereby leading to increased savings in cost while reducing complexity and improving reliability. Furthermore, because the phase shift requirements for the phase equalizers necessitate decreasing the phase shift with increasing frequency, the phase equalizers have to be actively controlled in accordance with the frequency of operation of the feedforward system. While this may be accomplished with conventional low power solid state components, this same control reduces the strict requirements previously needed in amplifiers 14 and 36. Specifically, since the phase equalizers 42 and 48 have to be controlled at each frequency, their control can be used to compensate for phase and amplitude linearity problems in the main amplifiers 14 and 36 to thereby linearize the operation of those signal paths. This allows the main and error amplifiers 14 and 36 to be implemented without the stringent phase and amplitude linearity requirements conventionally required for common feedforward systems. As a result, the main and error amplifiers may be more easily implemented with conventional solid state components.

Figure 3:
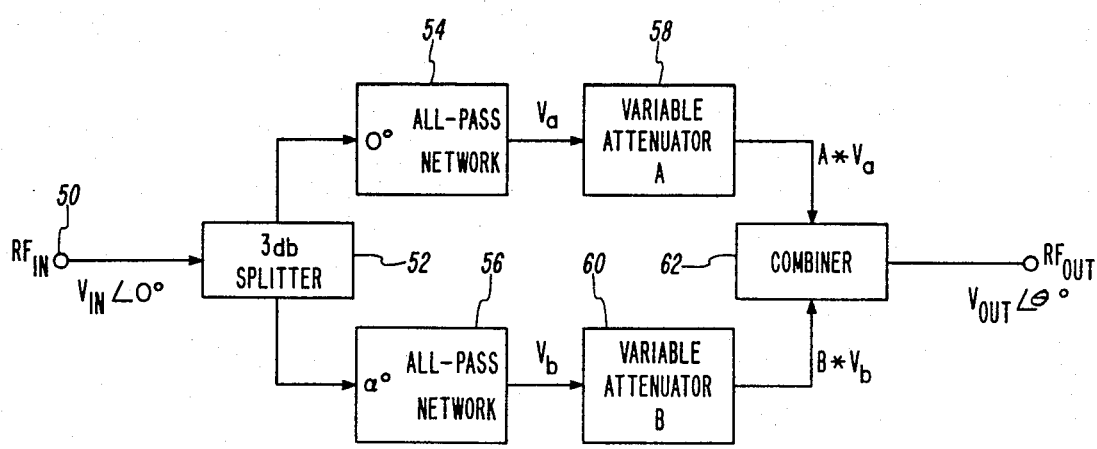
FIG. 3 is a schematic diagram of an improved broadband phase shift network.

In order to improve the implementation of such a feedforward system as is described above, there is disclosed in the aformentioned co-pending application entitled "Phase Shift Network with Minimum Amplitude Ripple", a broadband phase shift network. The circuit is generally shown in FIG. 3 and will be described in greater detail below. The circuit, however, provides a construction and operation which allows the phase shift output to be extended over a range greater than 90° with minimal amplitude variations by the use of one variable attenuator adjusted to achieve phase shift changes within the desired range of operation.

Referring now to FIG. 3, the signal input to the phase shift network is represented as a radio frequency input RF in which is generally a voltage Vin having a reference angle of 0° as represented in the drawing. This signal input at terminal 50 is provided as one input to a 3 dB splitter 52 having two outputs, each of which is connected through an all-pass network. The phase difference between the outputs from each of the all-pass networks is represented by denoting the all-pass network 54 as the 0° reference and the all-pass network 56 as an angle $\alpha$ wherein the output signal from the all-pass network 54 is Va and the output signal from the all-pass network 56 is Vb having a phase difference of $\alpha°$. The signals Va and Vb are coupled through respective variable attenuators 58 and 60 wherein the variable attenuators are represented by the letters A and B representing magnitudes of attenuation. The output signals from the attenuators are then denoted as A*Va and B*Vb, respectively. These output signals are coupled to a combiner 62 to provide the RF output represented by a voltage Vout having an angle $\theta$.

Figure 4A:
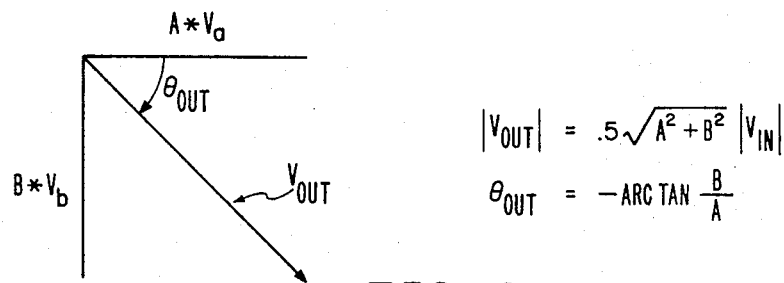
FIGS. 4a, 4b, and 4c are graphical representations used in explaining the operation of the circuit of FIG. 3.

With respect to the above network, if the angle $\alpha$ is 90°, the same acts as a conventional network which splits the input signal into phase and quadrature components, weights each component and adds the weighted components by performing a vector addition. This is more particularly shown in FIG. 4a wherein the voltage Vout at an angle $\theta$ is represented by the vector sum of A*Va and B*Vb where Va and Vb are separated by 90°. In that instance, $$V_{out} = .5 ( \sqrt{A^2 + B^2} ) |(V_{in})| \text{ and}$$

$$\theta = -\arctan (B/A)$$

Vout is thus phase shifted from the input Vin by the angle $\theta$. Constructing such a network so that the angle $\alpha$ is equal to 90°, however, results in several problems in implementation and application.

As will be seen, both the absolute value of Vout and $\theta$ are a function of the attenuators A and B. Therefore, if a constant amplitude of Vout is required for a varying phase $\theta$, both attenuators A and B must be adjusted simultaneously to different attenuation values to maintain that constant amplitude. By way of example, if B is held constant at 0 dB and A is varied, the resulting output is:

| Attenuator A (dB) | Vout/Vin (dB) | $\theta°$ |
|---|---|---|
| 1 | −.46 | −48.3 |
| 3 | −1.23 | −54.7 |
| 5 | −1.81 | −60.7 |
| 10 | −2.59 | −72.5 |

Accordingly, a 24.2° phase change is accompanied by a 2.13 dB amplitude variation. Thus, to achieve constant amplitude, additional control circuitry is necessary. Furthermore, in many applications, a full 0°–90° quadrant phase shift may be necessary. Although such is theoretically possible with the above circuit where $\alpha=90°$, the same would require an infinite attenuation from attenuators 58 and 60. Accordingly, when implemented with more practical attenuators having attenuation ranges of 0–10 dB, the maximum phase shift $\theta$ that could be obtained with the circuit of FIG. 3 (with $\alpha=90°$) would be in the range of 18° to 72°.

However, by using a construction of the circuit of FIG. 3, the above-noted drawbacks for an $\alpha$ of 90° can be overcome. In this particular instance, the all-pass networks are constructed to have a phase difference between the signals Va and Vb optimized in terms of the phase range required for the operation of the system and the amplitude variation that can be tolerated. In addition, the variable phase shift can be attained by adjusting only one attenuator at any given time. This may by implemented using the circuit of FIG. 3 by specifically calculating and fixing the value of $\alpha$ representing the phase shift between the outputs of the all-pass networks 54 and 56.

Figure 4B:
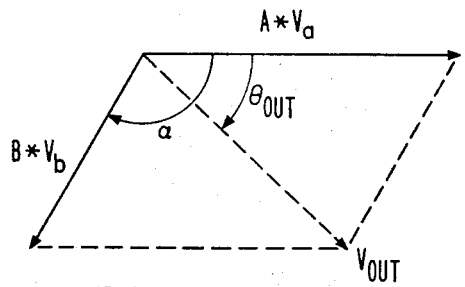
Figure 4C:
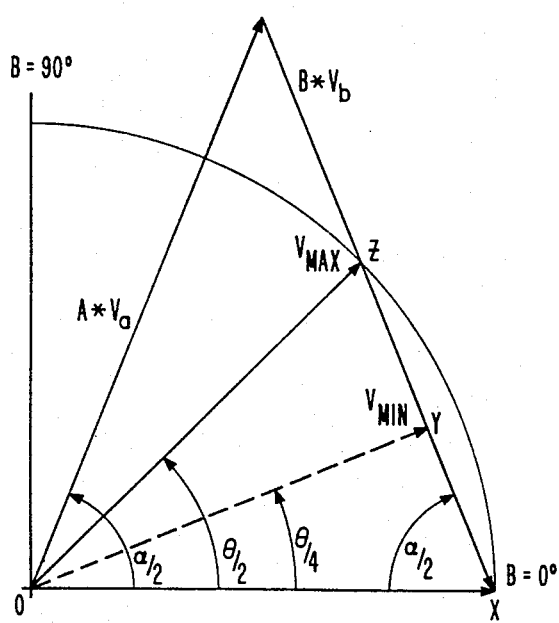

Referring now to FIGS. 4b and 4c, the vector voltages are shown along with the angles $\alpha$ and $\theta$ (in FIG. 4c, the vector voltages are placed head to tail to accomplish the vector addition). Now, if for purposes of reference to FIG. 4c, the reference phase is designated as $\beta$ and it is given that $\theta$ equals the phase range required for operation of the variable phase shift network, then $\alpha$ is defined as the phase difference which must be found and AV is the amplitude variation of Vout that occurs for a calculated $\alpha$ in the operation of the phase shift network, and:

$$AV = V_{min}/V_{max}$$

Vmin is defined to be equal to the minimum amplitude through the range of $\theta$, and Vmax is defined to be equal to the maximum amplitude through the same range of $\theta$.

Still referring to FIG. 4c, the minimum amplitude variation occurs when Vmax occurs at $\beta=0°$ and $\beta=\theta°/2$. Because the triangle formed by OXZ is an isosceles triangle, Vmin occurs at midway between $\beta=0°$ and $\beta=\theta/2$ (i.e., Vmin occurs at $\theta°/4$). Now looking at the triangle formed by OXY, $O+X+Y=180°$. Therefore, since $$O=\theta/4,$$

$$X=\alpha/2, \text{ and}$$

$$Y=90°,$$

it follows that $$\theta/4+\alpha/2+90°=180° \text{ and}$$

$$\theta/4+\alpha/2=90°$$

Accordingly, since $\theta$ is given as the phase range required, $$\alpha = 180° - \theta/2.$$

Now looking at the triangle OXY, it can be seen that it is a right triangle wherein:

$$\cos(\theta/4) = Vmin/Vmax = AV.$$

Therefore, given a phase shift range $\theta$, the circuit shown in FIG. 3 should be configured so that all-pass networks 54 and 56 produce outputs differing in phase $\alpha$, where $$\alpha = 180° - \theta/2$$

By using this, 0° to $\theta/2$° phase shift of the input signal may be obtained by adjusting the attenuator 60 only and $\theta/2$ to $\theta$ phase shift of the input signal may be obtained by adjusting only attenuator 58. Over this range, the amplitude variation will be minimized and will be of a value $$\cos(\theta/4)$$

It will also be seen that for $$0° < \theta < 90° \text{ then } -180° < \alpha < -135°.$$

For this range, $$V_{out} = .5 \, V_{in} \left( \sqrt{A^2 + 2AB \cos \alpha + B^2} \right)$$

and $$\theta = -\arctan(B \sin |\alpha|/(A + B \cos \alpha))$$

Using the above to compare the operation of the circuit of FIG. 3 for the phase difference fixed at $\alpha$ versus the phase difference fixed at 90°, reference will be made to the minimum amplitude variation and a 24.2° phase change obtained with one attenuator. In this instance, $\theta = 2 \, (24.2°) = 48.4°$. Thus, $$\alpha = -(180 - 24.2) = -155.8° \text{ and}$$

$$AV \, (dB) = 20 \log (\cos 48.4/4) = 0.195 \, dB$$

As a result, the following values can be obtained:

| Attenuator A (dB) | \|Vout/Vin\| (dB) | $\theta°$ |
|---|---|---|
| 0 | −13.56 | −77.9 |
| .8 | −13.76 | −90 |
| 1.7 | −13.56 | −102.3 |

It can be seen from the above, that the attenuation range required for attenuators 58 and 60 has thus been drastically reduced from that where $\alpha = 90°$. Specifically, when $\alpha = 90°$, infinite attenuation is required to achieve a 90° phase shift range with a 3 dB amplitude variation. For an $\alpha = 134°$, a 90° phase shift range may now be obtained for $\theta$ with a maximum attenuation equal to 7.9 dB and an amplitude variation of 0.72 dB.

It should be noted, however, that a fixed attenuation has been introduced into the circuit. This attenuation increases as the required phase shift range is decreased if minimum amplitude variation is maintained. Although this may be tolerated in many applications, amplitude variation can be sacrificed if required. Thus, by optimizing the all-pass phase difference for a given set of requirements, a phase shift of 90° or greater for $\theta$ may be realized in a practical manner. The system thus relaxes the requirements on the attenuators and greatly simplifies the control circuitry necessary to minimize amplitude variation for a selected range of phase shift.

Although the above feedforward system and the phase shift networks described in connection with the aforementioned co-pending applications produce improved feedforward system construction and operation, the same still requires that both loops include phase and amplitude equalizers. Accordingly, while improved performance over the prior art of FIG. 1 may be obtained, there has still not been a reduction in the number of equalization circuits needed to implement the system. Likewise, although the system of FIG. 2 reduces the power losses by inserting the amplitude and phase equalizers in the small signal paths, the necessity for active control of the phase and amplitude equalizers still requires multiple circuits and components. As will be appreciated, any reduction in the number of such circuits will lead to additional gains in simplicity as well as reductions in cost and improvements in reliability.

Figure 5:
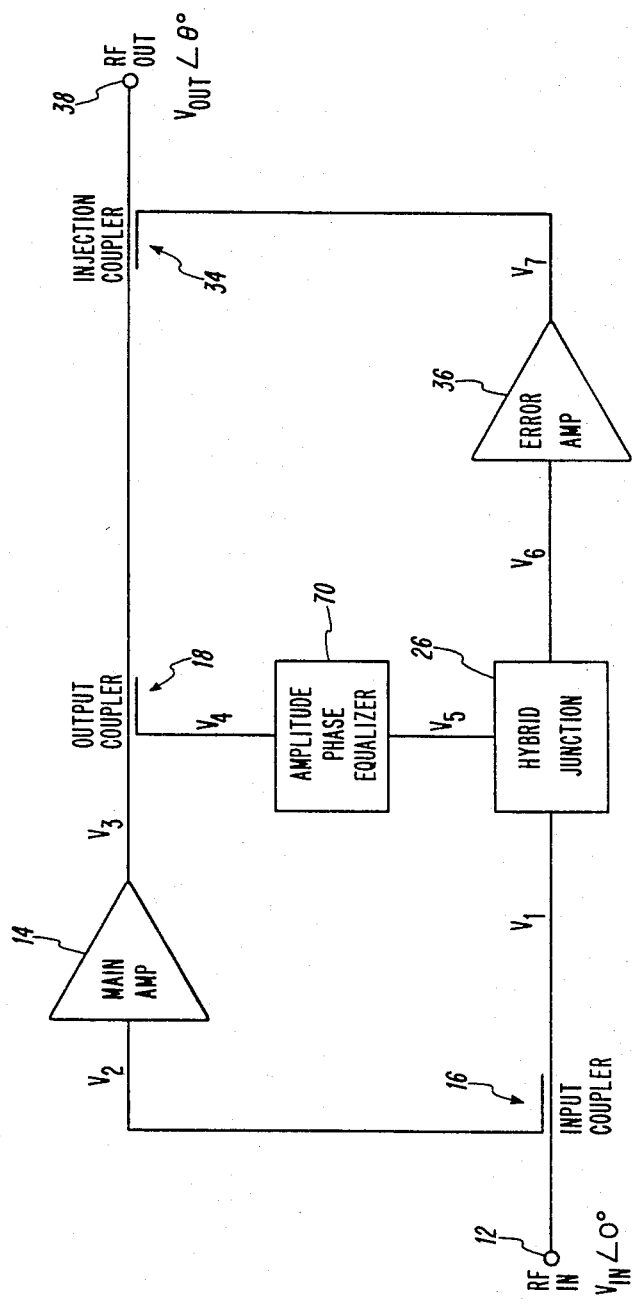
FIG. 5 is a detailed schematic diagram showing the improved feedforward system in accordance with the present invention.

Referring now to FIG. 5, there is shown a feedforward system which employs only one amplitude/phase equalizer in a small signal path for reducing intermodulation distortion products. Specifically, the circuit is constructed to have the same broad elements which were described with respect to FIGS. 1 and 2, and referenced by the same numerals. In this instance, however, the phase and amplitude equalizers in the input signal path as well as the error signal path are replaced with a single amplitude and phase equalizer 70 in the sampled output signal path leading to the hybrid junction 26 in line 20. Also, the power amplifier 14 and the error amplifier 36 are so constructed that they have substantially equal delay and gain characteristics. When this occurs, the amplitude/phase equalizer 70 can produce the necessary changes in phase and magnitude to provide proper subtraction in the hybrid junction 26 as well as in the injection coupler 34 after amplification of the error correction signal.

Referring again to FIG. 5, the sampled input RF signal is represented as voltage V2 while the input signal is represented as voltage V1. The sampled output signal V4 is coupled through phase and amplitude equalizer 70 to produce the voltage V5 from which is subtracted the voltage V1 in the hybrid junction to produce the error correction voltage V6. The error correction voltage V6 is amplified to an appropriate level by the error amplifier 36 to produce the amplified correction signal V7 which is then subtracted from the output signal to produce the voltage Vout forming the RF output signal 38. The amplitude/phase equalizer may be that as specified with respect to FIG. 3 to produce a minimum amplitude ripple for the desired phase shift.

In order to understand the operation of the feedforward system, reference will now be made to the nomenclature set forth in FIG. 5 as well as to additional terms defined as follows:

G1 = main amplifier voltage gain
$\theta$1 = main amplifier phase delay
D1∠$\theta$d = intermodulation products created by main amplifier at phase $\theta$d, not necessarily related to $\theta$1

G2 = error amplifier voltage gain
$\theta2$ = error amplifier phase delay
C1 = input coupler voltage coupling coefficient
C2 = output coupler voltage coupling coefficient
C3 = injection coupler voltage coupling coefficient
G3 = equalizer voltage gain (loss)
$\theta3$ = equalizer phase delay Now, using the values for voltages designated in FIG. 5, the following can be defined:

$V1 = Vin \angle 0°$ $V2 = C1\, Vin \angle 0°$ $V3 = G1C1Vin \angle -\theta1 + D1 \angle -\theta d$ $V4 = G1C1C2Vin \angle -\theta1 + C2D1 \angle \theta d$ $V5 = G1G3C1C2Vin \angle -(\theta1+\theta3) + G3C2 \cdot D1 \angle -(\theta1+\theta3)$ $V6 = V5 - V1$ Using the above, it will therefore be seen that:

$V6 = G1G3C1C2Vin \angle -(\theta1+\theta3) = Vin \angle 0° + G3C2D1 \angle -(\theta d+\theta3)$ If the equalizer is set to null the first loop, then let:

$G3 = \dfrac{1}{G1C1C2}$ and $\theta3 = 360° - \theta1$

Then $V6 = \dfrac{1}{(G1C1C2)} G1C1C2\, Vin \angle -(\theta1 + 360° - \theta1) -$ $Vin \angle 0° + \dfrac{C2D1}{G1C1C2} \angle -(\theta d + 360° - \theta1) =$ $\dfrac{D1}{G1C1} \angle -(\theta d - \theta1)$ and $V7 = \dfrac{G2D1}{G1C1} \angle -(\theta d - \theta1 + \theta2)$ If the injection coupler is configured so that it subtracts V7 from V3 in an inverting mode, then $Vout = V3 - C3V7$ $= G1C1Vin \angle -\theta1 + D1 \angle -\theta d - \dfrac{C3G2D1}{G1C1} \angle -(\theta d - \theta1 + \theta2)$ Recognizing that the main and error amplifiers are to be constructed to have equivalent gain and delay characteristics, the gains G1 and G2 are equal and the phase delays $\theta1$ and $\theta2$ are equal. As a result, $Vout = G1C1Vin \angle -\theta1 + D1 \angle -\theta d - \dfrac{C3G1D1}{G1C1} \angle -(\theta d - \theta1 + \theta1)$ $= G1C1Vin \angle -\theta1 + D1 \angle -\theta d - \dfrac{C3D1}{C1} \angle -\theta d$ Now, if the input coupler and injection coupler have equal coupling coefficients so that C1 = C3, then $Vout = G1C1Vin \angle -\theta1 + D1 \angle -\theta d - \dfrac{C1}{C1} D1 \angle -\theta d$ $= G1C1Vin \angle -\theta1$ As will be seen, therefore, the resulting output Vout is free from the distortion products created by the main amplifier. Since the solid state circuits formed in the main and error amplifiers as well as the circuits formed in the input, output and injection couplers can be constructed so that the above requirements for equal gain and delay and coupling coefficients are attained in a practical manner, the use of one amplitude/phase equalizer 70 is practically realizable in the circuit. Furthermore, although the main and error amplifiers must have identical gain and phase characteristics, they do not require flat gain, phase linearity, and zero phase intercept as do the amplifiers of a conventional feedforward system with coax delay lines as set forth in FIG. 1. The modular approach to amplifier design in present technology thereby allows the construction of amplifiers with substantially identical characteristics. These are all features which are not shown or suggested by the prior art.

Obviously many other modifications and variations of the present invention are possible in light of the above teachings. It is therefore to be understood that within the scope of the appended claims, the invention may be practiced otherwise than as specifically described.

What is claimed is:

1. A phase adjusted feedforward amplifier system comprising:
    means for providing an input signal;
    means for sampling said input signal and providing a sampled input signal;
    means for amplifying said sampled input signal and providing a main amplified output signal;
    means for sampling said main amplified output signal for providing a sampled output signal;
    means for phase and amplitude equalizing said sampled output signal to produce a phase and amplitude equalized sampled output signal;
    means for subtracting said sampled input signal from said phase and amplitude equalized sampled output signal to produce an error signal;
    means for amplifying said error signal to produce a correction signal; and
    means for subtracting said correction signal from said main amplified output signal to produce an amplified output of said input signal.

2. The system of claim 1 wherein said means for subtracting said sampled input signal and said sampled output signal comprises a hybrid junction.

3. The system of claim 1 wherein said means for amplifying is a high power, high frequency power amplifier.

4. In a feedforward power amplifying system having a radio frequency input signal, an amplifier for amplifying said input signal and providing an amplified output signal, means for sampling said input and output signals, means for subtracting the sampled input signal from the sampled output signal to produce an error signal, means for amplifying the error signal to produce a correction signal, and means for subtracting the correction signal from the output signal to produce an amplified radio frequency output, the improvement in said feedforward system comprising:

means for phase and amplitude equalizing only said sampled output signal.

5. The system of claim 4 wherein said means for amplifying said input signal and said means for amplifying said error signal are amplifiers having substantially identical gain and delay characteristics.

6. A phase adjusted feedforward amplifier system comprising:

means for providing an input signal;

means for sampling said input signal and providing a sampled input signal;

means for amplifying said sampled input signal comprising an amplifier having predetermined gain and delay characteristics and providing a main amplified output signal;

means for sampling said main amplified output signal for providing a sampled output signal;

means for phase and amplitude equalizing said sampled output signal to produce a phase and amplitude equalized sampled output signal;

means for subtracting said sampled input signal from said phase and amplitude equalized sampled output signal to produce an error signal;

means for amplifying said error signal comprising an amplifier having substantially identical gain and delay characteristics as said means for amplifying said input signal to produce a correction signal; and means for subtracting said correction signal from said main amplified output signal to produce an amplified output of said input signal.

* * * * *